United States Patent
Siriani et al.

(10) Patent No.: US 11,728,622 B2
(45) Date of Patent: Aug. 15, 2023

(54) SINGLE-FACET, VARIABLE-CONFINEMENT OPTICAL WAVEGUIDE AMPLIFIER

(71) Applicant: Cisco Technology, Inc., San Jose, CA (US)

(72) Inventors: Dominic F. Siriani, Allentown, PA (US); Vipulkumar K. Patel, Breinigsville, PA (US); Matthew J. Traverso, Santa Clara, CA (US); Mark A. Webster, Bethlehem, PA (US)

(73) Assignee: Cisco Technology, Inc., San Jose, CA (US)

( * ) Notice: Subject to any disclaimer, the term of this patent is extended or adjusted under 35 U.S.C. 154(b) by 1159 days.

(21) Appl. No.: 16/290,698

(22) Filed: Mar. 1, 2019

(65) Prior Publication Data

US 2020/0280171 A1    Sep. 3, 2020

(51) Int. Cl.
*H01S 5/10* (2021.01)
*H01S 5/34* (2006.01)
*H01S 5/50* (2006.01)
*H01S 5/22* (2006.01)
*H01S 5/14* (2006.01)

(52) U.S. Cl.
CPC ............ *H01S 5/101* (2013.01); *H01S 5/1003* (2013.01); *H01S 5/1014* (2013.01); *H01S 5/22* (2013.01); *H01S 5/34* (2013.01); *H01S 5/341* (2013.01); *H01S 5/50* (2013.01); *H01S 5/1025* (2013.01); *H01S 5/146* (2013.01)

(58) Field of Classification Search
CPC ............ H01S 5/14–148; H01S 5/1025; H01S 5/101; H01S 5/1014; H01S 5/2031; H01S 5/0287; H01S 5/026; H01S 5/1003; G02B 6/1228; G02B 6/14
See application file for complete search history.

(56) References Cited

U.S. PATENT DOCUMENTS

| | | | | |
|---|---|---|---|---|
| 10,320,151 | B1* | 6/2019 | Traverso | H01S 5/1203 |
| 11,073,661 | B1* | 7/2021 | Siriani | G02B 6/29331 |
| 2017/0207600 | A1* | 7/2017 | Klamkin | H01S 5/141 |
| 2018/0138658 | A1* | 5/2018 | Norberg | H04B 10/25 |
| 2019/0319427 | A1* | 10/2019 | Traverso | G02B 6/12004 |
| 2020/0366059 | A1* | 11/2020 | Kiyota | H01S 5/101 |

FOREIGN PATENT DOCUMENTS

JP    2012004441    *    1/2012    ............ H01S 5/50

OTHER PUBLICATIONS

Kaspar et al., "Packaged hybrid III-V/silicon SOA," ECOC (2014).
(Continued)

*Primary Examiner* — Tod T Van Roy
*Assistant Examiner* — Delma R Fordé
(74) *Attorney, Agent, or Firm* — Patterson + Sherdan, LLP

(57) ABSTRACT

An optical apparatus comprises a semiconductor substrate and an optical waveguide emitter. The optical waveguide emitter comprises an input waveguide section extending from a facet of the semiconductor substrate, a turning waveguide section optically coupled with the input waveguide section, and an output waveguide section extending to the same facet and optically coupled with the turning waveguide section. One or more of the input waveguide section, the turning waveguide section, and the output waveguide section comprises an optically active region.

15 Claims, 10 Drawing Sheets

(56) References Cited

OTHER PUBLICATIONS

Zhang et al., "Quantum dot SOA/silicon external cavity multi-wavelength laser," Opt. Exp., 23, 4666 (2015).
Zilkie et al., "Power-efficient III-V/Silicon external cavity DBR lasers," Opt. Exp., 20, 23456 (2012).
Klamkin et al., "High-output saturation power variable confinement slab-coupled optical waveguide amplifier," OFC/NFOEC, Los Angeles, CA (2011).
Juodawlkis et al., "Slab-coupled optical waveguide (SCOW) devices and photonic integrated circuits (PICs)," IEEE Photonics Conference, Bellevue, WA (2013).
Tohmori et al., "Spot-size converted 1.3 um laser with butt-jointed selectively grown vertically tapered waveguide," Electron. Lett., 31, 1069 (1995).
Budd et al., "Semiconductor optical amplifier (SOA) packaging for scalable and gain-integrated silicon photonic switching platforms," ECTC, San Diego, CA (2015).
Tuorila et al., Semiconductor Optical Amplifier with U-bend Geometry for Simplified Coupling to Silicon Photonics Waveguides (2018).
Juodawlkis et al., "High-Power, Low-Noise 1.5-?m Slab-Coupled Optical Waveguide (SCOW) Emitters: Physics, Devices, and Applications" IEEE JSTQE, 17, 1698.
J. J. Plant, P. W. Juodawlkis, R. K. Huang, J. P. Donnelly, L. J. Missaggia, and K. G. Ray, "1.5-?m InGaAsP—InP slab-coupled optical waveguide lasers," IEEE Photon. Technol. Lett. 17, 735 (2005).

\* cited by examiner

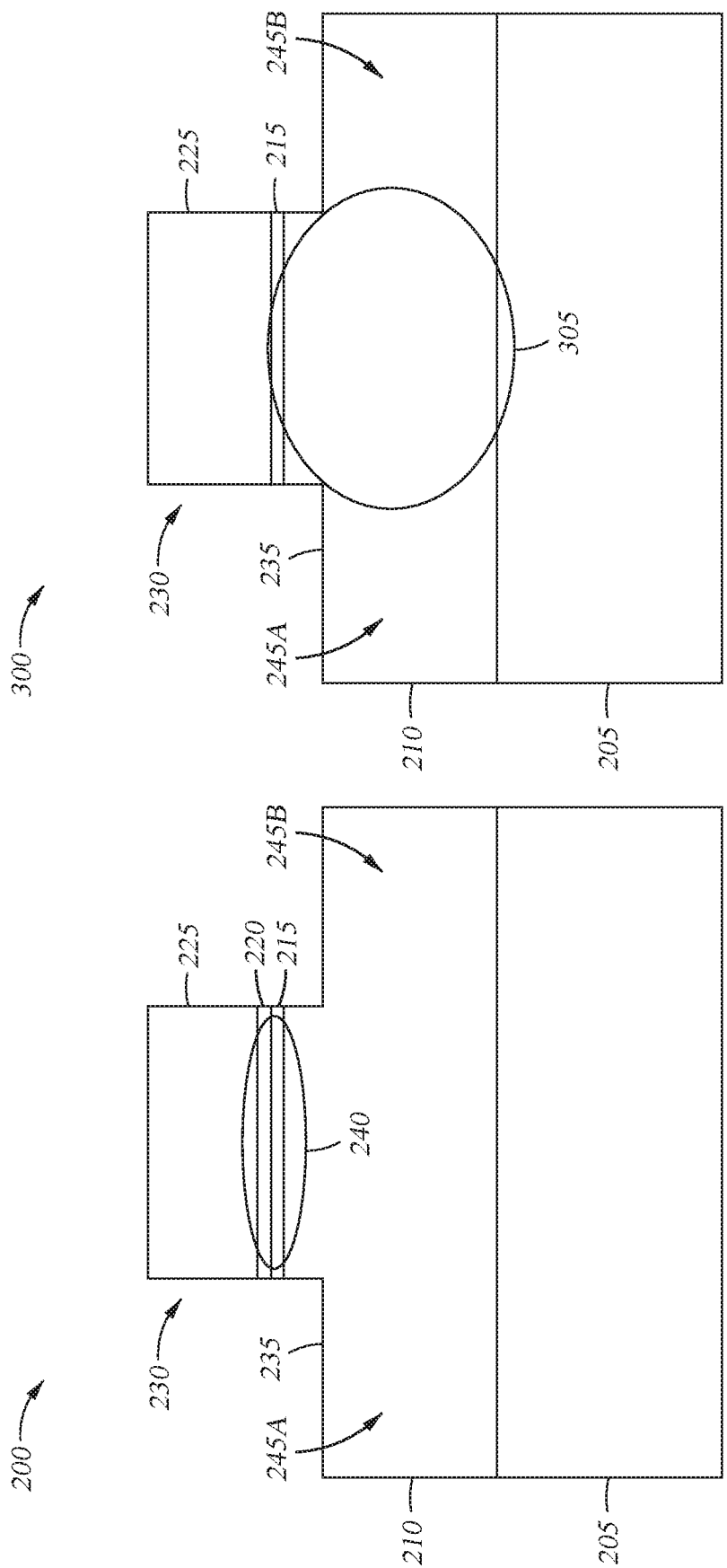

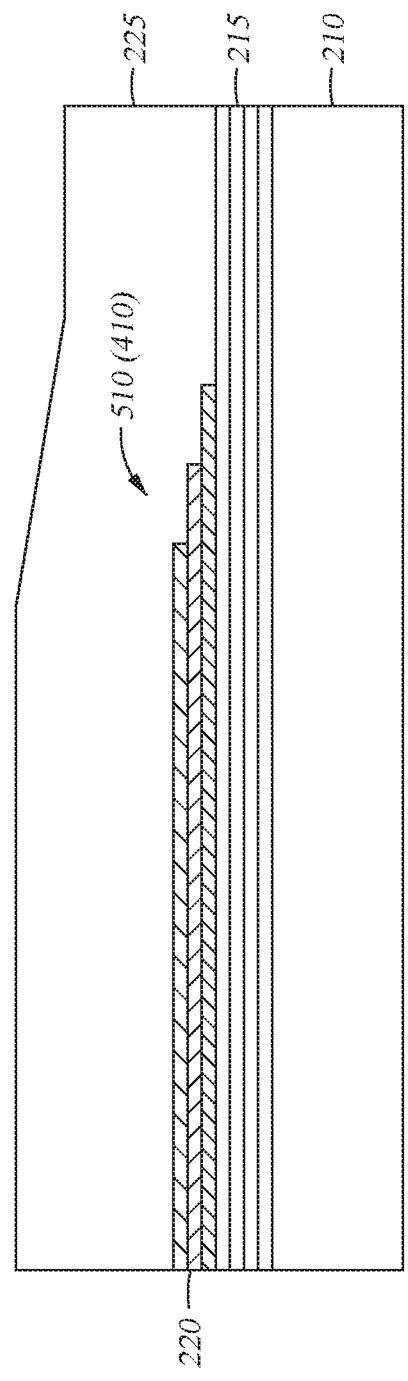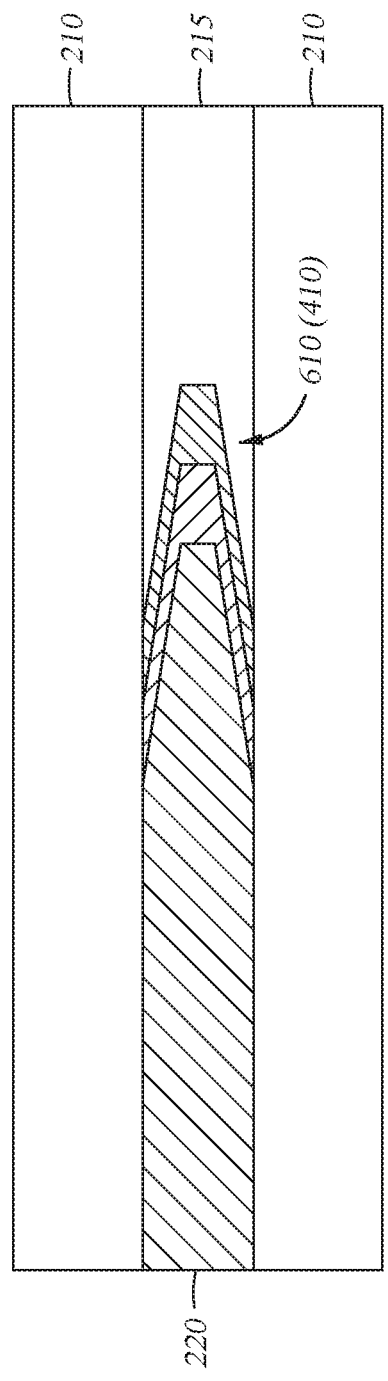

US 11,728,622 B2

SINGLE-FACET, VARIABLE-CONFINEMENT OPTICAL WAVEGUIDE AMPLIFIER

TECHNICAL FIELD

Embodiments presented in this disclosure generally relate to integrating a variable-confinement optical waveguide amplifier with a semiconductor-based photonic chip.

BACKGROUND

Several challenges are encountered when integrating laser sources or other optically active components with a semiconductor-based photonic chip. For example, an efficient coupling of light between the laser source and the photonic chip can require a complex and costly optical alignment process. To support higher data rates (e.g., through faster modulation and/or more optical channels), the laser source may be scaled to higher power levels. In some cases, additional optical components such as lenses and isolators may be needed to protect against optical feedback. In some cases, it may be necessary to attach a laser source to a submount before integrating with the photonic chip, which increases fabrication costs and reduces overall fabrication yields.

Semiconductor optical amplifiers (SOAs) are another possibility for achieving the higher optical power levels needed for higher data rates. Some applications of SOAs include fiber-to-fiber or waveguide-to-waveguide amplification, and input and output ports are typically located on opposing facets of a substrate. However, aligning the opposing facets with waveguides of a photonic chip is a complex process, often requiring alignment along six axes. Alignment is made even more difficult by the small inherent mode size of conventional SOAs, requiring a sub-micron alignment. Further, output power is limited by low saturation power of the SOA structures. Reflective SOAs (RSOAs) may also be used as a gain medium for an external cavity laser that interfaces at a single facet with a photonic chip.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2 and 3 are cross-sectional views of a variable-confinement slab-coupled optical waveguide (SCOW) emitter, according to one or more embodiments.

FIG. 5 is a side view of a plurality of layers providing a tapering in a first dimension, according to one or more embodiments.

FIG. 6 is a top view of one or more layers providing a tapering in a second dimension, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
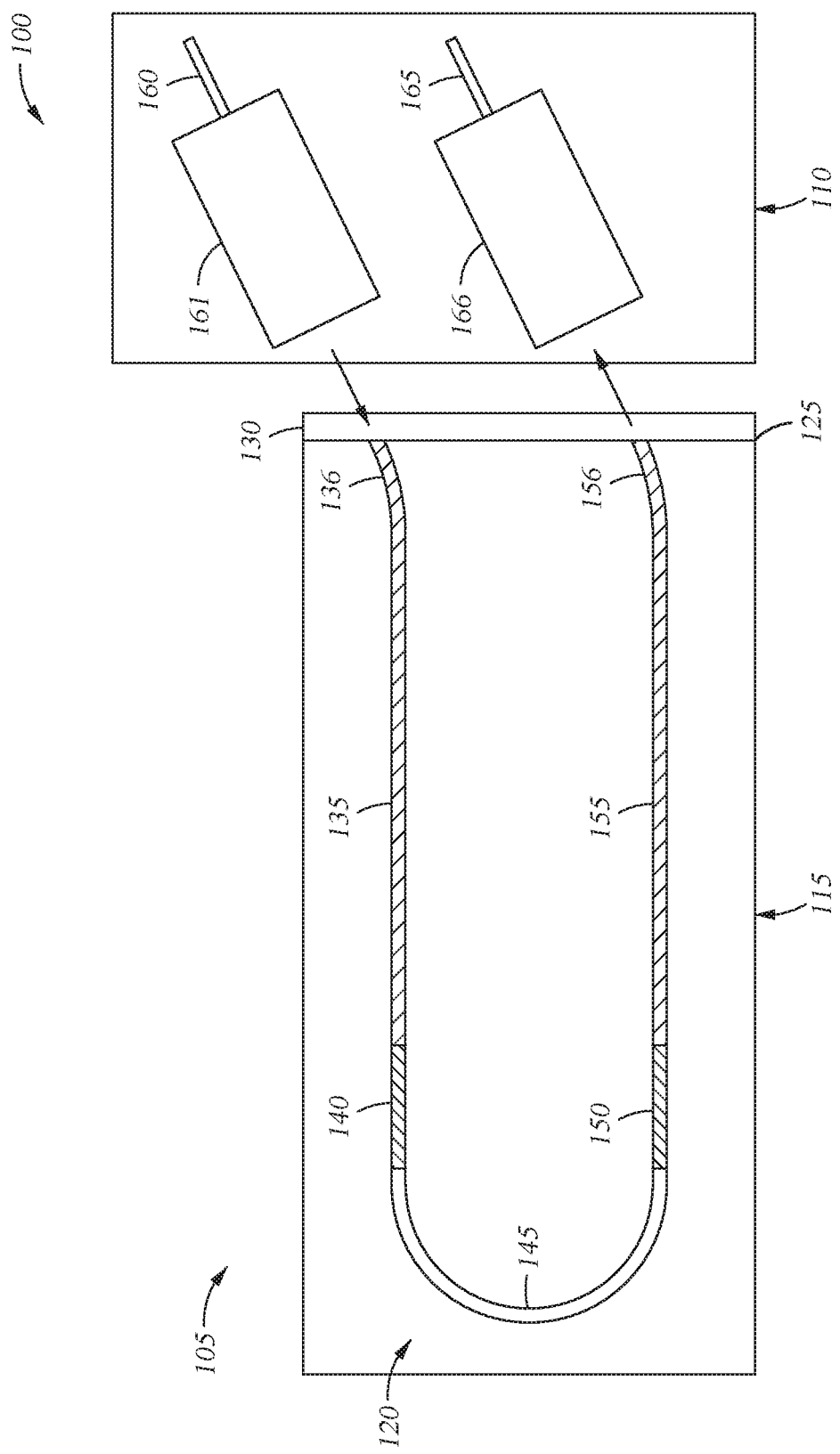
FIG. 1 is a top view of an optical system comprising a variable-confinement optical waveguide emitter, according to one or more embodiments.

One embodiment presented in this disclosure is an optical apparatus comprising a semiconductor substrate and an optical waveguide emitter. The optical waveguide emitter comprises an input waveguide section extending from a facet of the semiconductor substrate, a turning waveguide section optically coupled with the input waveguide section, and an output waveguide section extending to the same facet and optically coupled with the turning waveguide section. One or more of the input waveguide section, the turning waveguide section, and the output waveguide section comprises an optically active region.

Another embodiment presented in this disclosure is an optical system comprising a photonic chip comprising a first waveguide and a second waveguide, a semiconductor substrate comprising a facet, and an optical waveguide emitter disposed on the semiconductor substrate. The optical waveguide emitter comprises an input waveguide section extending from the facet and optically coupled with the first waveguide, a turning waveguide section optically coupled with the input waveguide section; and an output waveguide section extending to the facet and optically coupled with the turning waveguide section. One or more of the input waveguide section, the turning waveguide section, and the output waveguide section comprises an optically active region.

Another embodiment presented in this disclosure is a method for use with an optical waveguide emitter disposed on a semiconductor substrate. The method comprises receiving an optical signal at an input waveguide section extending from a facet of the semiconductor substrate, propagating the optical signal through a turning waveguide section, and emitting an amplified optical signal from an output waveguide section that extends to the same facet and is optically coupled with the turning waveguide section. One or more of the input waveguide section, the turning waveguide section, and the output waveguide section provide an optical gain to the optical signal.

Example Embodiments

Embodiments described herein include an optical apparatus having an optical waveguide emitter. In some embodiments, the optical apparatus is implemented as a SOA. The optical waveguide emitter includes an input waveguide section that is optically coupled with an output waveguide section through a turning waveguide section. The direction of light propagation through the optical waveguide emitter may be controlled using the turning waveguide section, such that the input waveguide section and the output waveguide section need not extend to opposing facets of a semiconductor substrate. For example, in some embodiments, the input waveguide section and the output waveguide section extend to a same facet of the semiconductor substrate. Beneficially, performing optical alignment of the optical waveguide emitter with another optical device (e.g., a photonic chip) may be less complex than when the input waveguide section and the output waveguide section extend to the opposing facets.

In some embodiments, the optical waveguide emitter is a variable-confinement optical waveguide emitter, and comprises one or more transition waveguide sections extending between waveguide sections having different optical confinements. For example, the turning waveguide section may have a greater optical confinement (e.g., a smaller optical mode size) than the input waveguide section and/or the output waveguide section. Beneficially, a turning waveguide section having a greater optical confinement may be implemented with a smaller bend radius, providing a lower optical loss through the turning waveguide section and supporting a reduced overall size of the optical waveguide emitter. In some embodiments, one or both of the input waveguide section and the output waveguide section comprises a SCOW. Beneficially, the larger optical mode size provided by the SCOW provides an improved optical coupling and misalignment tolerance of the optical waveguide emitter with, e.g., the photonic chip.

In some embodiments, one or more of the input waveguide section, the turning waveguide section, the transition waveguide section(s), and the output waveguide section comprises an optically active region. Any suitable optical gain material(s) may be used in the optically active region(s), such as quantum wells (QWs), quantum dots (QDs), quantum wires, etc., which may be electrically pumped and/or optically pumped. The arrangement and/or optical gain material(s) of the optically active region(s) may be selected to provide desired optical characteristics, such as one or more high power stages and/or one or more high gain stages of the optical waveguide emitter.

FIG. 1 is a top view of an optical system 100 comprising a variable-confinement optical waveguide emitter 120 (also referred to as optical waveguide emitter 120), according to one or more embodiments. In some embodiments, the optical waveguide emitter 120 comprises a SOA, although other implementations of the optical waveguide emitter 120 are also possible.

The optical system 100 comprises an optical apparatus 105 that is optically coupled with a photonic chip 110. The optical apparatus 105 comprises a semiconductor substrate 115, from which various optical and electrical components may be grown, patterned, etched, deposited, or eutectically bonded. In some embodiments, the semiconductor substrate 115 comprises a bulk silicon (Si) substrate, although other semiconductor materials are also contemplated. In some embodiments, the thickness of the semiconductor substrate 115 is between about 0.3 millimeters (mm) and about 1 mm. However, dimensions of the semiconductor substrate 115 may differ to account for new diameters and/or thicknesses desired in Si (or other semiconductor material) fabrication industries.

One or more features and/or materials of the optical waveguide emitter 120 are pre-processed in the semiconductor substrate 115. The optical waveguide emitter 120 comprises an input waveguide section 135, a first transition waveguide section 140, a turning waveguide section 145, a second transition waveguide section 150, and an output waveguide section 155.

The input waveguide section 135 extends from a facet 125 of the semiconductor substrate 115. The input waveguide section 135 receives an optical signal at an input port 136 arranged at the facet 125, and propagates the optical signal along a length of the input waveguide section 135. The first transition waveguide section 140 extends between the input waveguide section 135 and the turning waveguide section 145.

In some embodiments, the turning waveguide section 145 has a greater optical confinement than the input waveguide section 135. Beneficially, the turning waveguide section 145 having a greater optical confinement may be implemented with a smaller bend radius, providing a lower optical loss through the turning waveguide section 145 and supporting a reduced overall size of the optical waveguide emitter 120. In one embodiment, the turning waveguide section 145 has a greater optical confinement along one dimension. In another embodiment, the turning waveguide section 145 has a greater optical confinement along two dimensions. The turning waveguide section 145 is depicted as U-shaped, although other arrangements are also contemplated. In some embodiments, the turning waveguide section 145 has a bend radius between 25 microns and 1000 microns. In some embodiments, the turning waveguide section 145 has a bend radius between about 50 microns and 500 microns.

The first transition waveguide section 140 extends between the input waveguide section 135 and the turning waveguide section 145. The first transition waveguide section 140 gradually changes the optical confinement of a propagating optical signal (e.g., a size of the optical mode) along one or more dimensions, through a gradual increase or decrease of one or more material layers proximate to the optical waveguide. In some embodiments, the one or more material layers provide a greater average refractive index than that of the optical waveguide, such that the optical mode is more confined for an increase of the one or more material layers, and the optical mode is less confined for a decrease of the one or more material layers.

In one example, the increase of the one or more material layers of the first transition waveguide section 140 comprises an increased number of material layers, and changing the optical confinement is accomplished through gradually decreasing the number of material layers. In another example, the increase of the one or more material layers comprises an increased dimensioning of the one or more material layers, and changing the optical confinement is accomplished through decreasing the dimensioning (e.g., tapering the one or more material layers) in one or more dimensions. Thus, in the optical waveguide emitter 120, the one or more material layers of the first transition waveguide section 140 gradually increase along a direction of propagation of the optical signal (from the input waveguide section 135 to the turning waveguide section 145) to increase the optical confinement.

The second transition waveguide section 150 extends between the turning waveguide section 145 and the output waveguide section 155. The second transition waveguide section 150 gradually changes the optical confinement of a propagating optical signal (e.g., a size of the optical mode) along one or more dimensions, through a gradual increase or decrease of one or more material layers proximate to the optical waveguide. In some embodiments, the one or more material layers provide a greater average refractive index than that of the optical waveguide, such that the optical mode is more confined for an increase of the one or more material layers, and the optical mode is less confined for a decrease of the one or more material layers. In the optical waveguide emitter 120, the one or more material layers of the second transition waveguide section 150 gradually decrease along a direction of propagation of the optical signal (from the turning waveguide section 145 to the output waveguide section 155) to decrease the optical confinement.

The output waveguide section 155 extends to the same facet 125 of the semiconductor substrate 115. The optical signal when propagated through the output waveguide section 155 exits through an output port 156 arranged at the facet 125. In some embodiments, one or both of the input waveguide section 135 and the output waveguide section 155 comprises a SCOW. Stated another way, the input waveguide section 135 and/or the output waveguide section 155 have a lesser optical confinement than the turning waveguide section 145, such that the optical waveguide emitter 120 receives and/or provides a large size optical mode. In an alternate embodiment, the input waveguide section 135 and the output waveguide section 155 extend to different facets arranged along a same side of the semiconductor substrate 115.

One or more of the input waveguide section 135, the first transition waveguide section 140, the turning waveguide section 145, the second transition waveguide section 150, and the output waveguide section 155 comprises an optically active region. Thus, the optical waveguide emitter 120 comprises one or more optically active regions to provide an amplified optical signal at the output port 156. In cases where the optical waveguide emitter 120 comprises a plurality of optically active regions, the plurality of optically active regions of may be of a same type or of different types (e.g., providing different optical power levels or optical gain levels). In some embodiments, each of the one or more optically active regions comprises one or more of quantum wells, quantum dots, and quantum wires. However, other types of optically active materials are also contemplated. Further, the one or more optically active regions may be electrically pumped and/or optically pumped.

The photonic chip 110 and/or the optical waveguide emitter 120 may have a suitable configuration to mitigate back reflections when transmitting optical signals between the photonic chip 110 and the optical waveguide emitter 120. In some embodiments, the photonic chip 110 has an edge-coupled structure with an output port and an input port that are arranged to align with the input port 136 and the output port 156 of the optical waveguide emitter 120. In some embodiments, one or both of the input port 136 and the output port 156 are angled relative to a long axis of the input waveguide section 135 and/or the output waveguide section 155. For example, the long axis of the input waveguide section 135 and/or the output waveguide section 155 may be substantially orthogonal to the facet 125, and the input port 136 and/or the output port 156 may be non-orthogonal to the facet 125. In some embodiments, the angle of the input port 136 and the output port 156 have a same angling relative to the facet 125. In some embodiments, an antireflective coating 130 may be applied to the facet 125 to mitigate back reflections. Some non-limiting examples of the antireflective coating 130 include one or more layers of aluminum oxide ($Al_2O_3$), titanium dioxide ($TiO_2$), silicon dioxide ($SiO_2$), silicon nitride (SiN), magnesium fluoride ($MgF_2$), tantalum pentoxide ($Ta_2O_5$), etc. deposited at the facet 125.

The photonic chip 110 comprises a first waveguide 160 (e.g. a sub-micron waveguide), a first spot size converter 161, a second waveguide 165 (e.g. a sub-micron waveguide), and a second spot size converter 166. Although not shown, the first waveguide 160 may be optically coupled with an optical source, such as an integrable tunable laser assembly (ITLA) that transmits a continuous wave (CW) optical signal (e.g., an unmodulated optical signal) through the first waveguide 160. Other types of optical sources and/or optical signals are also contemplated. In some embodiments, the output power provided by the optical source is insufficient for performing coherent modulation, and the optical waveguide emitter 120 provides an amplified optical signal from the output port 156 that has an output power sufficient for performing coherent modulation.

In some embodiments, the first waveguide 160 (e.g., a sub-micron waveguide) of the photonic chip 110 routes the CW optical signal to the first spot size converter 161. Because the optical mode of the CW optical signal in the first waveguide 160 may be much smaller than the mode size of the waveguide in the input waveguide section 135 (e.g., a SCOW), the first spot size converter 161 increases the mode size to better match the mode of the waveguide in the input waveguide section 135. As such, the optical coupling efficiency between the photonic chip 110 and the optical waveguide emitter 120 is improved. In one alternate embodiment, the optical mode of the CW optical signal in the first waveguide 160 and/or the second waveguide 165 is similar to the mode size of the waveguide in the input waveguide section 135 and/or the output waveguide section 155, such that the photonic chip 110 need not include the first spot size converter 161 and/or the second spot size converter 166. In another alternate embodiment, the optical mode of the CW optical signal in the first waveguide 160 and/or the second waveguide 165 is greater than the mode size of the waveguide in the input waveguide section 135 and/or the output waveguide section 155, such the first spot size converter 161 may decrease the mode size and/or the second spot size converter 166 may increase the mode size.

Thus, during operation of the optical system 100, after the CW optical signal propagates through the first spot size converter 161, the CW optical signal exits the photonic chip 110 and is received by the optical waveguide emitter 120 at the input port 136. The CW optical signal propagates through the input waveguide section 135 and through the first transition waveguide section 140. After the mode size of the CW optical signal is reduced by the first transition waveguide section 140, the CW optical signal is reoriented as it propagates through the turning waveguide section 145. The mode size of the CW optical signal is increased by the second transition waveguide section 150, and the CW optical signal is propagated along the output waveguide section 155. The (now amplified) CW optical signal exits the optical waveguide emitter 120 at the output port 156, and is received by the photonic chip 110 at the second spot size converter 166. The second spot size converter 166 reduces the mode size of the CW optical signal, which is provided to the second waveguide 165.

Thus, in the optical system 100, the optical waveguide emitter 120 provides an optical amplification for optical signals carried on the photonic chip 110 with a relatively simple optical alignment process. The large optical mode supported by the input waveguide section 135 and/or the output waveguide section 155 improves a coupling efficiency and a misalignment tolerance. The integrated mode transition (or conversion) provided by first transition waveguide section 140 and/or the second transition waveguide section 150 allows use of a tightly-confined mode for sharp turns and a large SCOW mode for external coupling. The optical system 100 also supports multi-stage amplification with a high-gain, low-power SOA (in the tightly-confined regions) on the same chip as a low-gain, high-power SOA (in the SCOW regions).

FIGS. 2 and 3 are cross-sectional views 200, 300 of a variable-confinement SCOW emitter, according to one or more embodiments. The features depicted in the views 200, 300 may be used in conjunction with other embodiments described herein. For example, the SCOW emitter depicted in the views 200, 300 may be included in the variable-confinement optical waveguide emitter 120 of FIG. 1. The view 200 may represent a high optical confinement region, such as the turning waveguide section 145 of the optical waveguide emitter 120. The view 300 may represent a low optical confinement region, such as the input waveguide section 135 and/or the output waveguide section 155 of the optical waveguide emitter 120.

In the view 300, the SCOW emitter comprises a first cladding layer 205, a waveguide layer 210 arranged over the first cladding layer 205, an optically active region 215 arranged over the waveguide layer 210, and a second cladding layer 225 arranged over the optically active region 215. Any suitable optical gain material(s) may be used in the optically active region 215, such as QWs, QDs, quantum wires, etc., which may be electrically pumped and/or optically pumped.

In some embodiments, the SCOW emitter is formed over a submount, such as a semiconductor wafer (e.g., a silicon substrate). For example, the first cladding layer 205 may contact the submount. In some embodiments, the waveguide layer 210 is doped a first conductivity type, and the second cladding layer 225 is doped a different, second conductivity type. In some embodiments, the first cladding layer 205 is doped the first conductivity type. Although not shown, a second waveguide layer may be arranged over the optically active region 215, and the second waveguide layer is doped the second conductivity type.

The SCOW emitter is formed as a ridge 230 extending from a slab 235. The slab 235 is formed in the waveguide layer 210. The ridge 230 is formed partly in the second cladding layer 225, partly in the mode conversion layer 220, partly in the optically active region 215, and partly in the waveguide layer 210. Thus, the ridge 230 forms part of a ridge waveguide which generally confines the optical signal within a portion of the waveguide layer 210 (represented in the view 300 as the optical mode 305). Stated another way, the majority of the power of the optical signal is confined within the region defined by the optical mode 305.

Unlike other semiconductor optical amplifiers (SOAs) that include an active region at or near the middle of the optical mode 305, in the SCOW emitter the optically active region 215 is located near a border of the optical mode 305 (e.g., the top portion of the optical mode 305). Thus, most of the optical signal propagates in the slab 235, apart from the optically active region 215 and the ridge 230.

In some embodiments, the waveguide layer 210 has a thickness between 3-5 microns and is formed from a III-V semiconductor material or alloy. In some embodiments, the width of the ridge 230 (as shown, in the left-right direction) is between 3-5 microns. With such dimensioning, the diameter of the optical mode 305 may be 4-5 microns, which is much larger than most SOAs that support single mode amplification. As the mode size increases, the optical signal typically has multiple modes. However, the SCOW emitter can have a large mode size and still support single mode amplification because of slab regions 245A, 245B of the slab 235. As an optical signal propagating in the SCOW emitter generates additional modes, these modes are transmitted into, and filtered out, by the slab regions 245A and 245B. In this manner, the SCOW emitter supports single mode operation at larger mode sizes supported by other SOAs. In one embodiment, the SCOW emitter is a single-mode amplifier with a mode size of the fundamental mode greater than 2.5 microns $1/e^2$ diameter; other modes supported by the waveguide experience a net loss because of the coupling to the slab. The relationship $1/e^2$ is a typical metric for describing the size of a Gaussian beam.

As mentioned above, the relatively large size of the optical mode 305 relaxes the alignment tolerances for aligning the SCOW emitter to the spot size converters of the photonic chip. Further, the amplification generated by the SCOW emitter can compensate for the higher losses suffered when data rates are increased. For example, the SCOW emitter can be used in a transmitter that has an optical signal greater than 50 GHz and supporting data rates between 100 Gbps and 1 Tbps.

In the high optical confinement region illustrated in the view 200, the SCOW emitter further comprises a mode conversion layer 220 that is arranged over the optically active region 215, and the second cladding layer 225 is arranged over the mode conversion layer 220. The mode conversion layer 220 comprises one or more layers of material(s) having a higher refractive index than the waveguide layer 210. In this way, the mode conversion layer 220 provides a greater optical confinement of a propagating optical signal, illustrated as a confined optical mode 240. As mentioned above, the greater optical confinement available through the mode conversion layer 220 supports lower optical loss and/or smaller dimensioning of the SCOW emitter.

Although illustrated as being arranged over the optically active region 215, the mode conversion layer 220 may have alternate arrangement within the SCOW emitter. In one alternate embodiment, the optically active region 215 is arranged over the mode conversion layer 220. In another alternate embodiment, the mode conversion 220 replaces the optically active region 215 in a passive region of the SCOW emitter.

Figure 4:
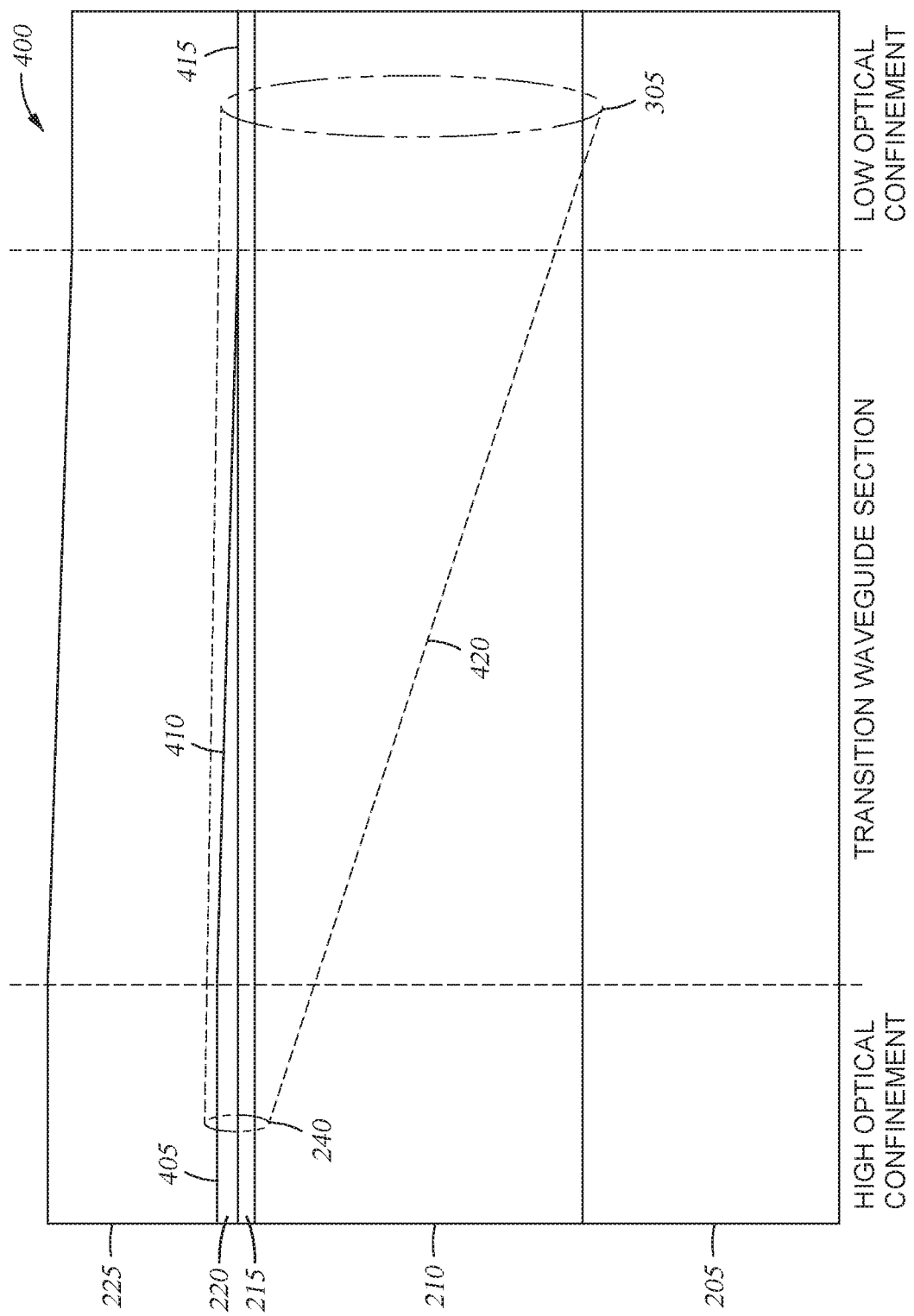
FIG. 4 is a side view of a variable-confinement SCOW emitter, according to one or more embodiments.

FIG. 4 is a side view 400 of a variable-confinement SCOW emitter, according to one or more embodiments. The features depicted in the view 400 may be used in conjunction with other embodiments described herein. For example, the SCOW emitter depicted in the view 400 may correspond to the cross-sectional views 200, 300 of FIGS. 2 and 3. More specifically, in some examples, the transition waveguide section in the view 400 may correspond to the first transition waveguide section 140 and/or the second transition waveguide section 150 of FIG. 1, the region of high optical confinement may correspond to the turning waveguide section 145, and the region of low optical confinement may correspond to the input waveguide section 135 and/or the output waveguide section 155. However, the transition waveguide section, the region of high optical confinement, and/or the region of low optical confinement may correspond to different portions of the optical waveguide emitter 120.

In the view 400, the mode conversion layer 220 comprises a first region 405 having a substantially constant height, and a second region 410 having a gradually increasing (or decreasing) height. The first region 405 corresponds to the region of high optical confinement (e.g., the confined optical mode 240), and the second region 410 corresponds to a region of transitioning optical confinement (e.g., a transitioning optical mode 420 between a low optical confinement and a high optical confinement). In some embodiments, within the second region 410, the one or more layers of the mode conversion layer 220 provide a tapering in one or more dimensions to provide an increased optical confinement. In a third region 415, the height of the mode conversion layer 220 may be zero, providing a region of low optical confinement (e.g., the optical mode 305).

The mode conversion layer 220 may have any suitable shape in the second region 410 to provide a desired transition of the optical confinement. For example, the mode conversion layer 220 may change continuously or non-continuously in the second region 410. In some embodiments, the mode conversion layer 220 changes linearly in the second region 410. In other embodiments, the mode conversion layer 220 changes non-linearly in the second region 410.

In one embodiment, the mode conversion layer 220 comprises a single material layer, and the tapering of the mode conversion layer 220 is achieved through variable-rate selective area growth of the single material layer. In another embodiment, the mode conversion layer 220 comprises a plurality of material layers, and the tapering of the mode conversion layer 220 is achieved through decreasing the number of material layers. Such an embodiment is illustrated in a side view 500 of FIG. 5, where a plurality of material layers 510 provide a stepped tapering of the mode conversion layer 220 in the second region 410.

The side views 400, 500 illustrate a transitioning of the optical confinement along one dimension (i.e., the vertical dimension). Additionally or alternatively, the mode conversion layer 220 may provide a transitioning of the optical confinement along one or more other dimensions. For example, FIG. 6 is a top view 600 of one or more material layers 610 that provide a tapering of the mode conversion layer 220 in a second dimension. Referring also to the side views 400, 500, the tapering illustrated in the view 600 provides a transitioning of the optical confinement in a dimension that extends into and out of the page.

The example implementation of the optical waveguide emitter 120 in FIG. 1 is depicted as having the input port 136 angled similarly to the output port 156, having the input waveguide section 135 and the output waveguide section 155 with similar lengths, having the first transition waveguide section 140 and the second transition waveguide section 150 with similar lengths, and having the turning waveguide section 145 that is symmetrical. Additionally, each of the input waveguide section 135, the first transition waveguide section 140, the turning waveguide section 145, the second transition waveguide section 150, and the output waveguide section 155 are depicted as having an optically active region 215.

Figure 7:
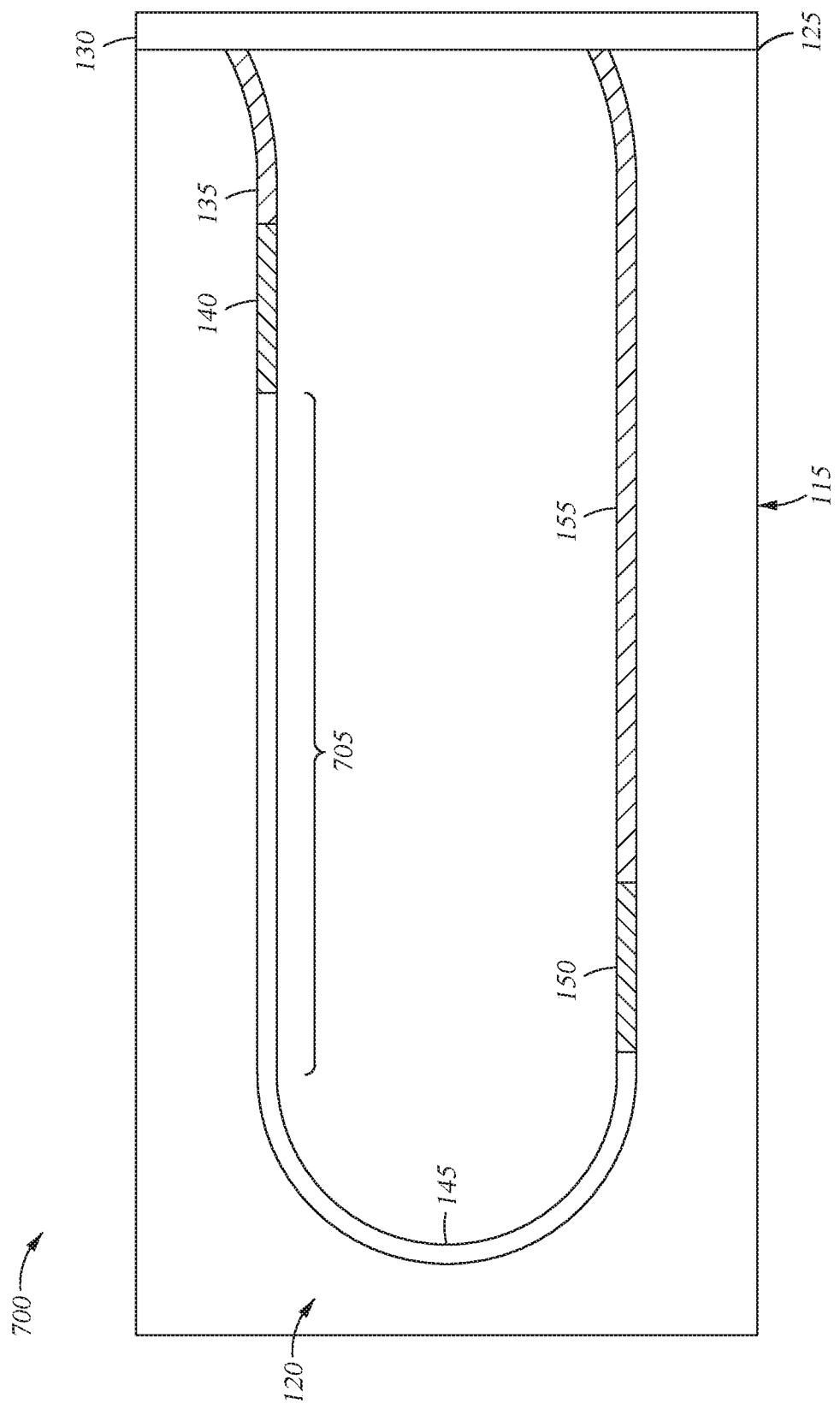
FIG. 7 is a top view of a variable-confinement optical waveguide emitter having an extended optical confinement region, according to one or more embodiments.

However, other implementations of the optical waveguide emitter 120 are also contemplated. In some embodiments, as illustrated in a top view 700 in FIG. 7, the optical waveguide emitter 120 includes an extended optical confinement region 705, and the output waveguide section 155 is longer than the input waveguide section 135. Due to the extended optical confinement region 705 being the input side (i.e., the side including the input waveguide section 135) of the turning waveguide section 145, the turning waveguide section 145 has an asymmetrical appearance. In an alternate embodiment, the extended optical confinement region 705 is arranged on the output side (i.e., the side including the output waveguide section 155) of the turning waveguide section 145. In another alternate embodiment, the input side and the output side of the turning waveguide section 145 each include an extended optical confinement region 705.

In some embodiments, the optical waveguide emitter 120 comprises one or more optically passive sections. Each active section generally includes an optically active region 215 having suitable optical gain material(s). In some embodiments, a passive section does not include the optical gain material(s). In other embodiments, the passive section includes the optical gain material(s), but optical gain provided by the optical gain material(s) is mitigated through techniques such as QW intermixing.

Further, as mentioned above, the optical waveguide emitter 120 comprises one or more optically active regions. In cases where the optical waveguide emitter 120 comprises a plurality of optically active regions, the plurality of optically active regions of may be of a same type or of different types (e.g., providing different optical power levels or optical gain levels).

Figure 8:
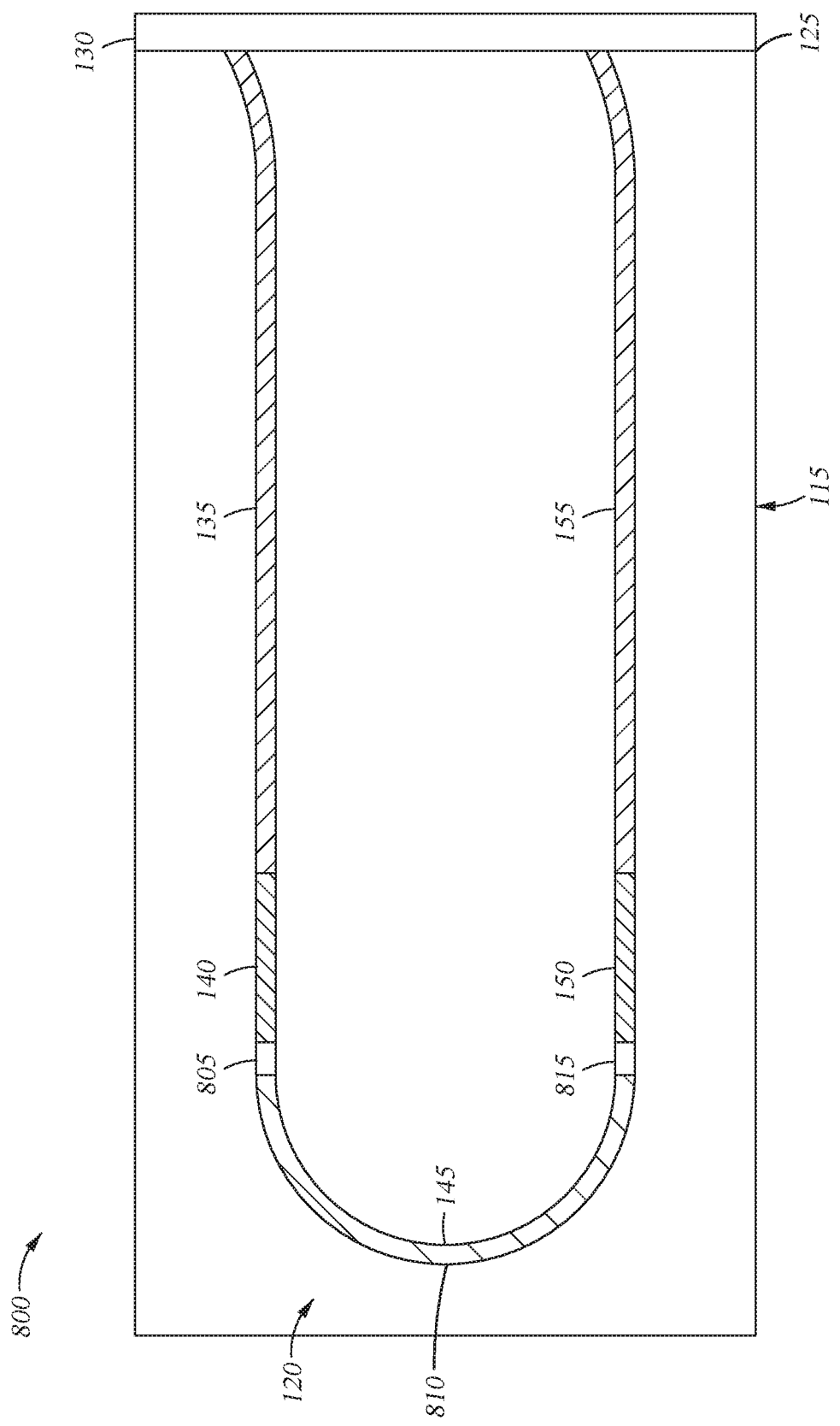
FIG. 8 is a top view of a variable-confinement optical waveguide emitter having a partially passive turning waveguide section, according to one or more embodiments.

As illustrated in a top view 800 in FIG. 8, the optical waveguide emitter 120 includes a partially passive turning waveguide section 145. More specifically, the turning waveguide section 145 comprises a first active section 805 comprising an optically active region, a second passive section 810, and a third active section 815. In other embodiments, the turning waveguide section 145 includes a different number of active sections. For example, the turning waveguide section 145 may be entirely passive.

Figure 9:
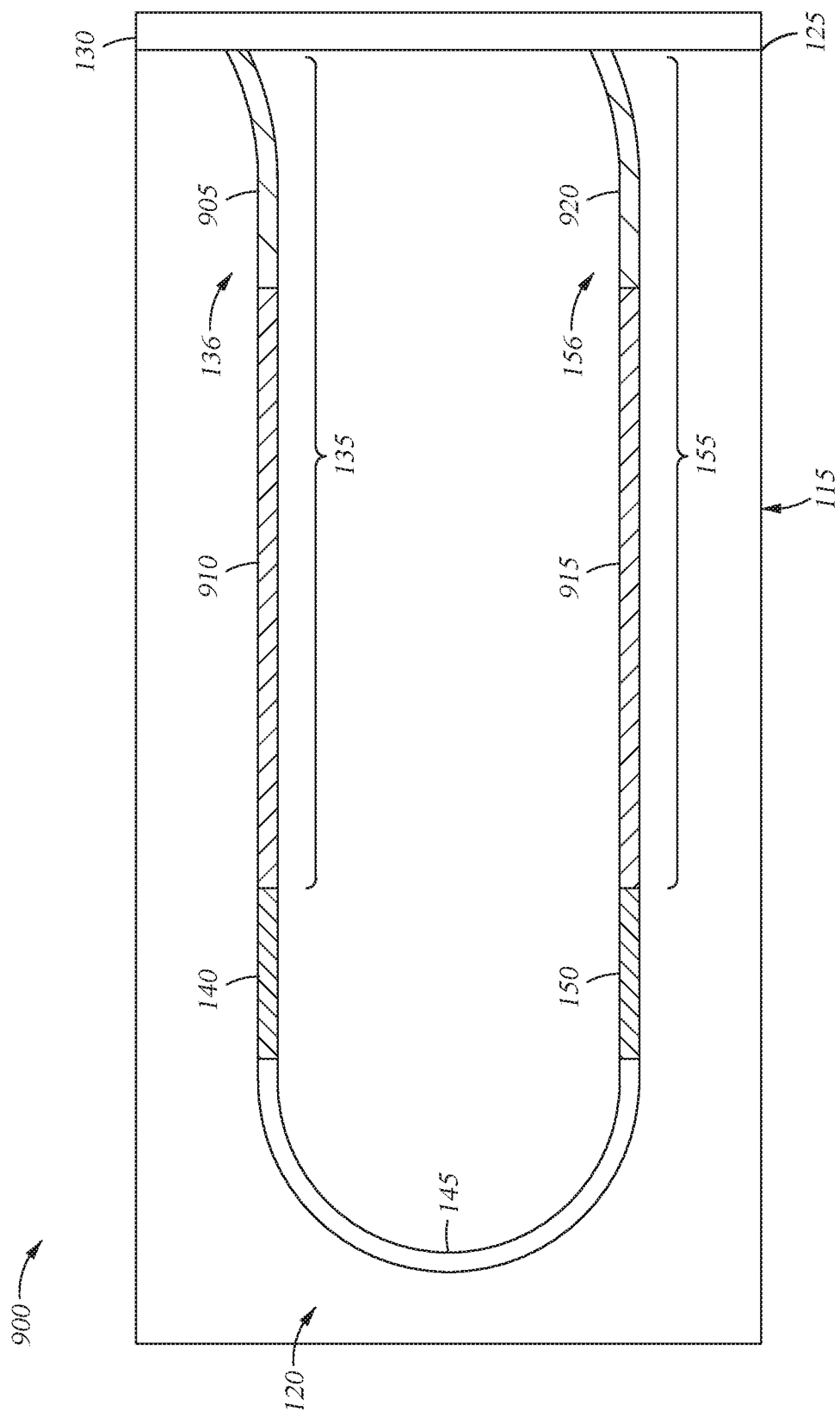
FIG. 9 is a top view of a variable-confinement optical waveguide emitter having a partially passive input waveguide section and output waveguide section, according to one or more embodiments.

As illustrated in a top view 900 in FIG. 9, the optical waveguide emitter 120 includes a partially passive input waveguide section 135 and a partially passive output waveguide section 155. More specifically, the input waveguide section 135 comprises a first passive section 905 and a second active section 910, and the output waveguide section 155 comprises a third active section 915 and a fourth passive section 920. As shown, the first passive section 905 and the fourth passive section 920 are arranged at the input port 136 and the output port 156, respectively. In other embodiments, the first passive section 905 and/or the fourth passive section 920 are arranged away from the input port 136 and/or the output port 156. In other embodiments, the input waveguide section 135 and/or the output waveguide section 155 includes a different number of passive sections. For example, the input waveguide section 135 and/or the output waveguide section 155 may be entirely passive.

Figure 10:
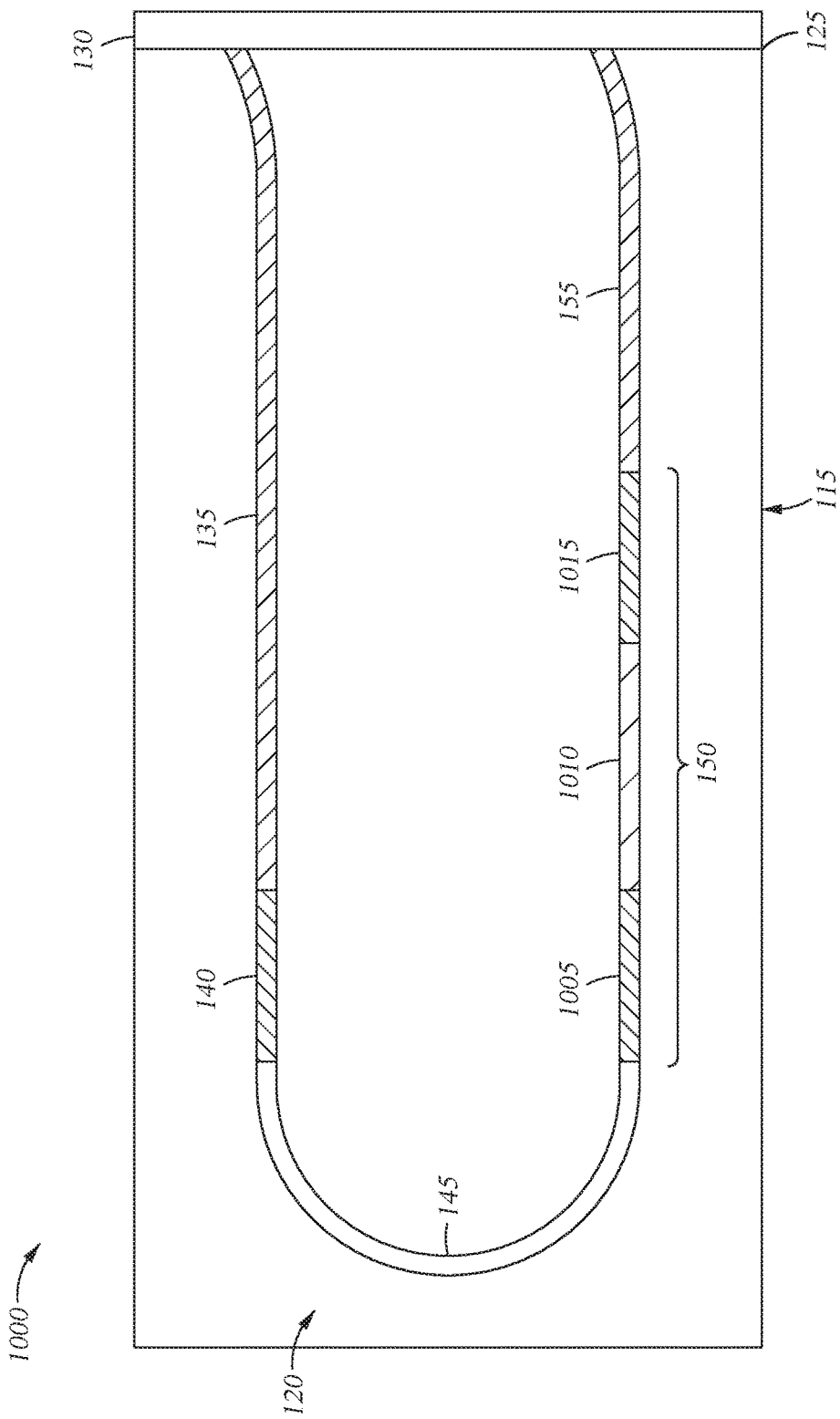
FIG. 10 is a top view of a variable-confinement optical waveguide emitter with a transition waveguide section providing multiple optical confinement transitions, according to one or more embodiments.

As illustrated in a top view 1000 in FIG. 10, the optical waveguide emitter 120 includes a transition waveguide section providing multiple optical confinement transitions. More specifically, the second transition waveguide section 150 comprises a first waveguide subsection 1005 extending to the turning waveguide section 145 and providing a first optical confinement transition, a second waveguide subsection 1015 extending to the output waveguide section 155 and providing a second optical confinement transition, and an intermediate waveguide subsection 1010 extending between the first waveguide subsection 1005 and the second waveguide subsection 1015. The intermediate waveguide subsection 1010 may be passive, or may include an optically active region.

In other embodiments, the first transition waveguide section 140 comprises multiple optical confinement transitions in addition to, or alternate to, the second transition waveguide section 150. In other embodiments, the first transition waveguide section 140 and/or the second transition waveguide section 150 include a different number of waveguide subsections providing optical confinement transitions and/or a different number of intermediate waveguide subsections.

Figure 11:
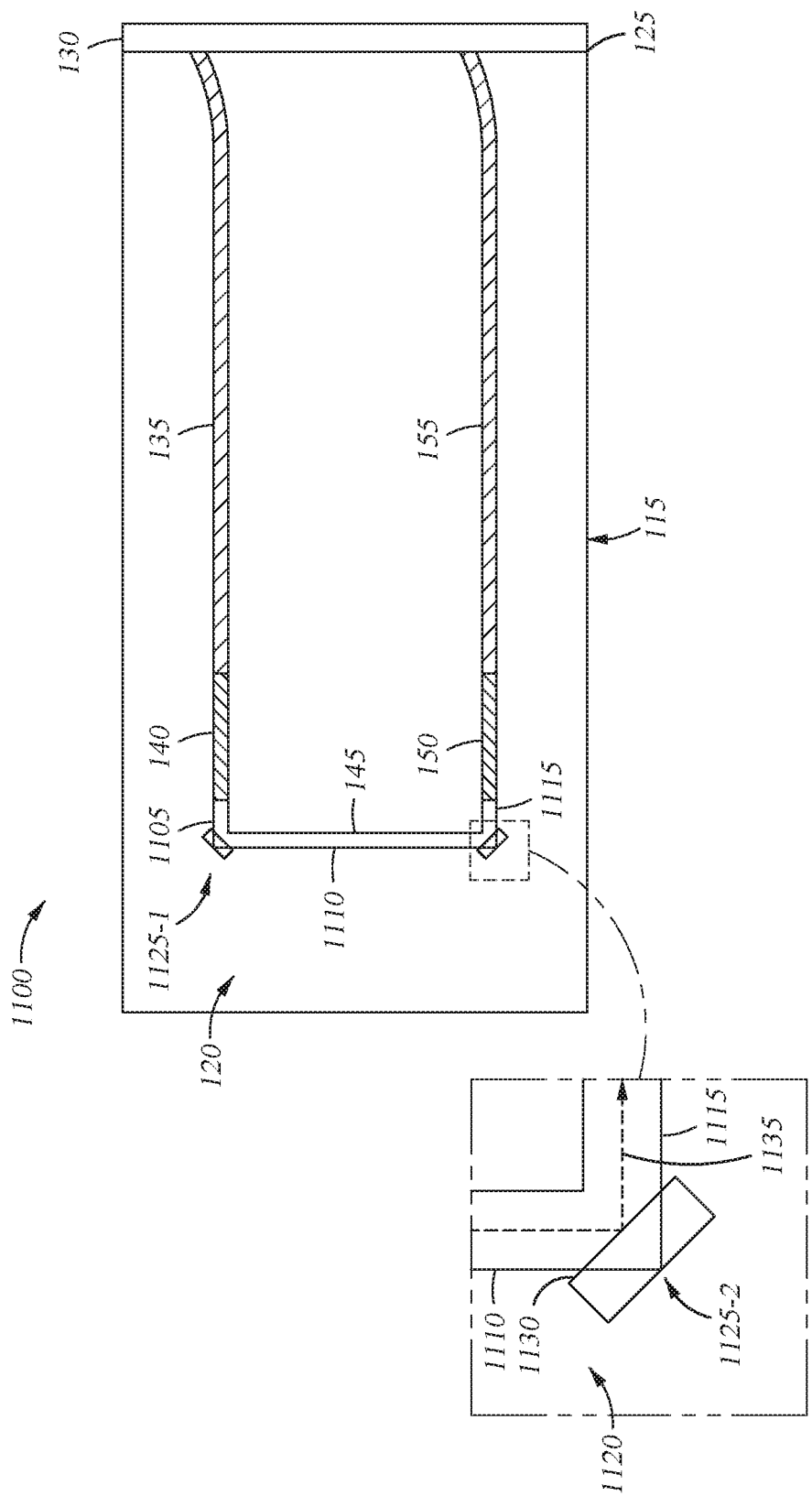
FIG. 11 is a top view of a variable-confinement optical waveguide emitter with turning mirrors in the turning waveguide section, according to one or more embodiments.

As illustrated in a top view 1100 in FIG. 11, the optical waveguide emitter 120 includes multiple turning mirrors in the turning waveguide section 145. More specifically, the turning waveguide section 145 comprises a first waveguide subsection 1105 extending to the first transition waveguide section 140, a second waveguide subsection 1110 extending from the first transition waveguide 140 to a third waveguide subsection 1115, which extends to the second transition waveguide section 150. A first turning mirror 1125-1 is disposed at the intersection of the first waveguide subsection 1105 and the second waveguide subsection 1110, and a second turning mirror 1125-2 is disposed at the intersection of the second waveguide subsection 1110 and the third waveguide subsection 1115. As shown, the first waveguide subsection 1105 is inline with the first transition waveguide section 140, the second waveguide subsection 1110 is orthogonal to the first waveguide subsection 1105, and the first turning mirror 1125-1 is oriented at 45 degrees relative to the first waveguide subsection 1105. The third waveguide subsection 1115 is orthogonal to the second waveguide subsection 1110, and the second turning mirror 1125-2 is oriented at 45 degrees relative to the second waveguide subsection 1110. The third waveguide subsection 1115 is inline with the second transition waveguide section 150. In this way, an optical signal exiting the first transition waveguide section 140 propagates along the first waveguide subsection 1105 and is reflected by the first turning mirror 1125-1 onto the second waveguide subsection 1110. As shown in the inset 1120, an optical signal 1135 propagating along the second waveguide subsection 1110 is incident on a surface 1130 of the turning mirror 1125-2, and is reflected by the turning mirror 1125-2 onto the third waveguide subsection 1115. The optical signal 1135 then enters the second transition waveguide section 150. Although the first turning mirror 1125-1 and the second turning mirror 1125-2 are described as being oriented at 45 degrees for orthogonal waveguide subsections, the different waveguide subsections and the turning mirrors of the turning waveguide section 145 may have any suitable alternate arrangement.

The turning mirrors 1125-1, 1125-2 may have any suitable configuration. In some embodiments, the turning mirrors 1125-1, 1125-2 are sized such that most or all of the optical mode of the optical signal 1135 is incident on the turning mirrors 1125-1, 1125-2. In some embodiments, each of the turning mirrors 1125-1, 1125-2 extends from an etched pocket formed into the semiconductor substrate 115. For example, the etched pocket may be formed using a dry etching process, such as reactive-ion etching (RIE), inductively coupled plasma (ICP)-RIE, focused ion beam (FIB), chemically-assisted ion beam etching (CAIBE), and so forth. In a total internal reflection (TIR) implementation of the turning mirrors 1125-1, 1125-2, the etched pocket may be coated or filled with a dielectric material (e.g., $SiO_2$ or SiN) for surface protection and/or passivation. In a non-TIR implementation of the turning mirrors 1125-1, 1125-2, the etched pocket may be coated or filled with a metallic material (e.g., silver or gold).

Figure 12:
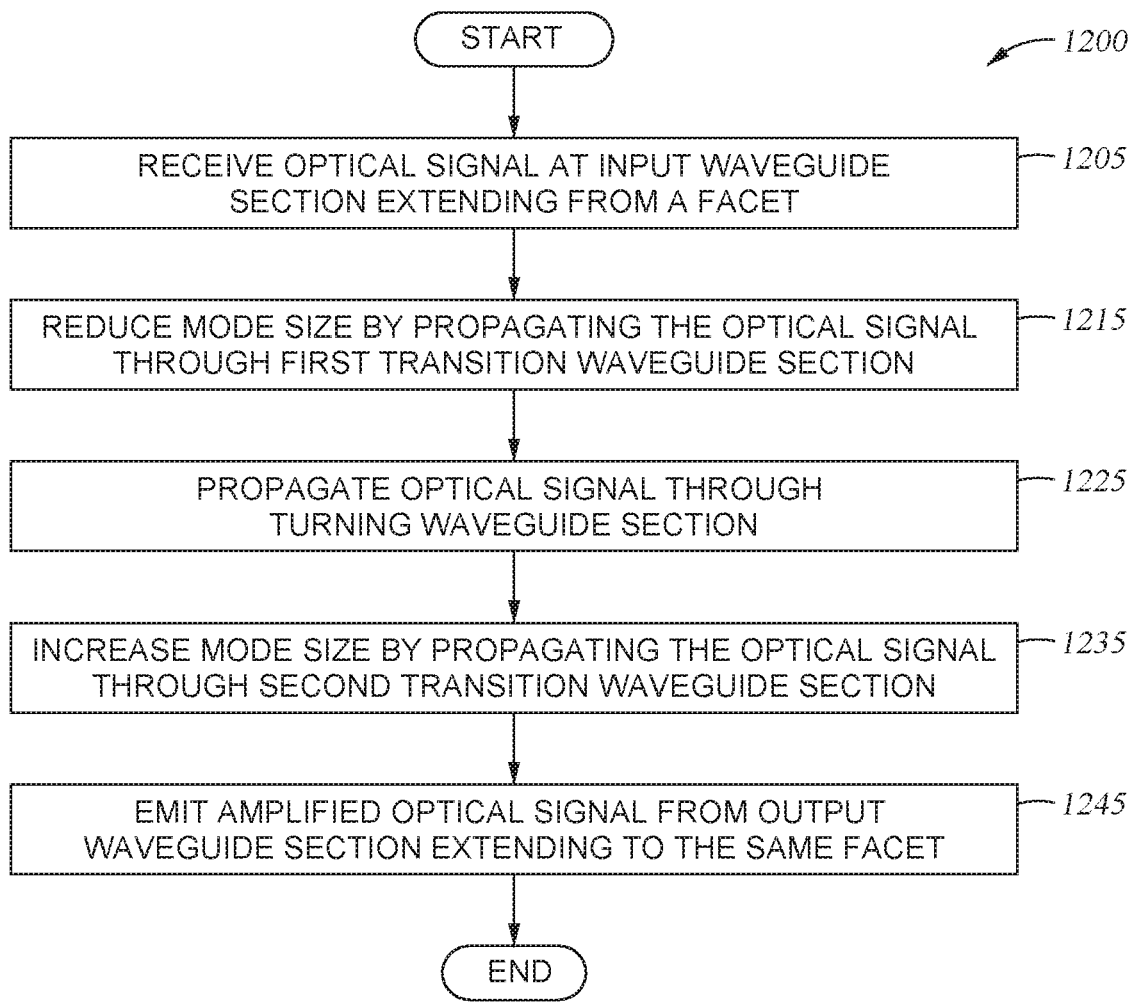
FIG. 12 is a method for use with an optical waveguide emitter disposed on a semiconductor substrate, according to one or more embodiments.

FIG. 12 is a method 1200 for use with an optical waveguide emitter disposed on a semiconductor substrate, according to one or more embodiments. The method may be used in conjunction with other embodiments, such as during operation of the optical waveguide emitter 120. The method 1200 begins at block 1205, where an optical signal is received in an input waveguide section extending from a facet. In some embodiments, the facet is formed in a semiconductor substrate. At block 1215, the mode size of the optical signal is reduced by propagating the optical signal through a first transition waveguide section. At block 1225, the optical signal with the reduced mode size is propagated through a turning waveguide section. At block 1235, the mode size of the optical signal is increased by propagating the optical signal through a second transition waveguide section. At block 1245, an amplified optical signal is emitted from an output waveguide section extending to the same facet. The method 1200 ends following completion of block 1245.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical apparatus comprising:
a semiconductor substrate; and
an optical waveguide emitter comprising:
an input waveguide section extending from a facet of the semiconductor substrate;
a first transition waveguide section optically coupled to the input waveguide section;
a turning waveguide section optically coupled with the first transition waveguide section;
a second transition waveguide section optically coupled to the turning waveguide section; and
an output waveguide section extending to the facet and optically coupled with the second transition waveguide section, wherein a waveguide layer and an optically active region positioned on the waveguide layer extend through the input waveguide section, the first transition waveguide section, the turning waveguide section, the second transition waveguide section, and the output waveguide section, wherein a mode conversion layer is positioned on the optically active region in the first transition waveguide section, the turning waveguide section, and the second transition waveguide section such that the optically active region is positioned between the waveguide layer and the mode conversion layer, and wherein the mode conversion layer has a higher refractive index than the waveguide layer.

2. The optical apparatus of claim 1, wherein a portion of the mode conversion layer in the first transition waveguide section comprises one or more layers providing a tapering in one or more dimensions.

3. The optical apparatus of claim 1, wherein the second transition waveguide section comprises:
a first waveguide subsection extending to the turning waveguide section and providing a first optical confinement transition;
a second waveguide subsection extending to one of: the input waveguide section and the output waveguide section, the second waveguide subsection providing a second optical confinement transition; and
an intermediate waveguide subsection extending between the first waveguide subsection and the second waveguide subsection.

4. The optical apparatus of claim 1, wherein the turning waveguide section has a greater optical confinement than at least one of: (i) the input waveguide section, and (ii) the output waveguide section.

5. The optical apparatus of claim 4, wherein one or both of the input waveguide section and the output waveguide section comprises a slab-coupled optical waveguide.

6. The optical apparatus of claim 1, wherein the turning waveguide section has a waveguide bend.

7. The optical apparatus of claim 1, wherein the turning waveguide section comprises one or more turning mirrors extending from an etched pocket formed into the semiconductor substrate.

8. The optical apparatus of claim 1, wherein the optically active region comprises one or more of quantum wells, quantum dots, and quantum wires.

9. An optical system comprising:
a photonic chip comprising a first waveguide and a second waveguide;
a semiconductor substrate comprising a facet; and
an optical waveguide emitter disposed on the semiconductor substrate, the optical waveguide emitter comprising:
an input waveguide section extending from the facet and optically coupled with the first waveguide;
a first transition waveguide section optically coupled to the input waveguide section;
a turning waveguide section optically coupled with the first transition waveguide section;
a second transition waveguide section optically coupled to the turning waveguide section; and
an output waveguide section extending to the facet and optically coupled with the second transition waveguide section, wherein a waveguide layer and an optically active region positioned on the waveguide layer extend through the input waveguide section, the first transition waveguide section, the turning waveguide section, the second transition waveguide section, and the output waveguide section, wherein a mode conversion layer is positioned on the optically active region in the first transition waveguide section, the turning waveguide section, and the second transition waveguide section such that the optically active region is positioned between the waveguide layer and the mode conversion layer, and wherein the mode conversion layer has a higher refractive index than the waveguide layer.

10. The optical system of claim 9, wherein a portion of the mode conversion layer in the first transition waveguide section comprises one or more layers providing a tapering in one or more dimensions.

11. The optical system of claim 9, wherein the second transition waveguide section comprises:
a first waveguide subsection extending to the turning waveguide section and providing a first optical confinement transition;
a second waveguide subsection extending to one of: the input waveguide section and the output waveguide section, the second waveguide subsection providing a second optical confinement transition; and
an intermediate waveguide subsection extending between the first waveguide subsection and the second waveguide subsection.

12. The optical system of claim 9, wherein the turning waveguide section has a greater optical confinement than at least one of: (i) the input waveguide section, and (ii) the output waveguide section.

13. The optical system of claim 12, wherein one or both of the input waveguide section and the output waveguide section comprises a slab-coupled optical waveguide.

14. The optical system of claim 9, wherein the optically active region comprises one or more of quantum wells, quantum dots, and quantum wires.

15. A method for use with an optical waveguide emitter disposed on a semiconductor substrate, the method comprising:
receiving an optical signal at an input waveguide section extending from a facet of the semiconductor substrate;
increasing, in a first transition waveguide section optically coupled to the input waveguide section, an optical confinement of the optical signal propagating from the input waveguide section and through the first transition waveguide section;
propagating the optical signal through a turning waveguide section optically coupled to the first transition waveguide section;
decreasing, in a second transition waveguide section optically coupled to the turning waveguide section, the optical confinement of the optical signal propagating from the turning waveguide section and through the second transition waveguide section; and
emitting an amplified optical signal from an output waveguide section that extends to the facet and is optically coupled with the second transition waveguide section, wherein a waveguide layer and an optically active region positioned on the waveguide layer extend through the input waveguide section, the first transition waveguide section, the turning waveguide section, the second transition waveguide section, and the output waveguide section provide an optical gain to the optical signal, wherein a mode conversion layer is positioned on the optically active region in the first transition waveguide section, the turning waveguide section, and the second transition waveguide section such that the optically active region is positioned between the waveguide layer and the mode conversion layer, and wherein the mode conversion layer has a higher refractive index than the waveguide layer.

\* \* \* \* \*